United States Patent
Ji (10) Patent No.: US 11,402,431 B2
(45) Date of Patent: Aug. 2, 2022

(54) DETECTION CIRCUIT AND DETECTION METHOD

(71) Applicant: CHANGXIN MEMORY TECHNOLOGIES, INC., Anhui (CN)

(72) Inventor: KangLing Ji, Shanghai (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/445,606

(22) Filed: Aug. 22, 2021

(65) Prior Publication Data

US 2022/0057449 A1 Feb. 24, 2022

Related U.S. Application Data

(63) Continuation of application No. PCT/CN2021/100487, filed on Jun. 17, 2021.

(30) Foreign Application Priority Data

Aug. 20, 2020 (CN) .......................... 202010844304.1

(51) Int. Cl.
| | |
|---|---|
| *H03K 5/135* | (2006.01) |
| *G01R 31/317* | (2006.01) |
| *H03L 7/087* | (2006.01) |
| *H03K 19/20* | (2006.01) |
| *H03K 5/00* | (2006.01) |

(52) U.S. Cl.
CPC ....... *G01R 31/31727* (2013.01); *H03K 5/135* (2013.01); *H03K 19/20* (2013.01); *H03L 7/087* (2013.01); *H03K 2005/00286* (2013.01)

(58) Field of Classification Search
None
See application file for complete search history.

(56) References Cited

U.S. PATENT DOCUMENTS

| | | | |
|---|---|---|---|
| 5,553,275 | A | 9/1996 | Langendorf |
| 6,150,859 | A | 11/2000 | Park |
| 7,646,224 | B2 | 1/2010 | Sundby |
| 2002/0051510 | A1 | 5/2002 | Noguchi |
| 2008/0272808 | A1 | 11/2008 | Sundby |

(Continued)

FOREIGN PATENT DOCUMENTS

| | | |
|---|---|---|
| CN | 101046489 A | 10/2007 |
| CN | 101141128 A | 3/2008 |
| CN | 101551418 A | 10/2009 |

(Continued)

*Primary Examiner* — Cassandra F Cox (74) *Attorney, Agent, or Firm* — Syncoda LLC; Feng Ma (57) ABSTRACT

A detection circuit is configured to detect phase information between two clock signals of different frequencies, and the two clock signals include a low frequency clock signal and a high frequency clock signal. The detection circuit includes: a signal generation module, configured to detect the low frequency clock signal at an edge of the high frequency clock signal to generate a to-be-sampled signal, and generate a target sampling signal when the high frequency clock signal is kept at a preset level and the low frequency clock signal meets a preset condition; and a sampling module, connected with the signal generation module and configured to detect the to-be-sampled signal at an edge of the target sampling signal to generate a detection result signal.

13 Claims, 5 Drawing Sheets

(56) References Cited

U.S. PATENT DOCUMENTS

2012/0303996 A1* 11/2012 Bauernfeind ......... H04L 7/0012
　　　　　　　　　　　　　　　　　　　　　　　713/503
2021/0111724 A1*  4/2021 Jung ..................... H03L 7/099

FOREIGN PATENT DOCUMENTS

| CN | 106357266 A | 1/2017 |
| CN | 110958015 A | 4/2020 |
| CN | 111555754 A | 8/2020 |
| CN | 212622809 U | 2/2021 |
| EP | 1199804 A2  | 4/2002 |

* cited by examiner

DETECTION CIRCUIT AND DETECTION METHOD

CROSS-REFERENCE TO RELATED APPLICATIONS

The present application is continuation of international application PCT/CN2021/100487 filed on Jun. 17, 2021, which claims priority to Chinese Patent Application No. 202010844304.1 filed on Aug. 20, 2020. The disclosures of these applications are hereby incorporated by reference in their entireties.

BACKGROUND

Phase detection is a method of detecting a phase relationship between two clock signals and generating an output signal corresponding to the phase relationship. Initially, frequencies of the two clock signals for phase detection are the same, and traditional phase detection circuits may meet the demand. The continuous development of science and technology puts forward a new demand for the phase detection, that is, the phase detection for a high frequency clock signal and a low frequency clock signal. Based on an original phase detection method, a function of performing the phase detection on clock signals with different frequencies may be basically implemented in a mode of performing frequency division on a high frequency clock signal and then performing the phase detection.

SUMMARY

The present application relates to a detection circuit and a detection method.

According to various embodiments, a first aspect of the present application provides a detection circuit configured to detect phase information between two clock signals of different frequencies. The two clock signals include a low frequency clock signal and a high frequency clock signal. The detection circuit includes a signal generation module and a sampling module.

The signal generation module is configured to detect the low frequency clock signal at an edge of the high frequency clock signal to generate a to-be-sampled signal, and generate a target sampling signal when the high frequency clock signal is kept at a preset level and the low frequency clock signal meets a preset condition.

The sampling module is connected with the signal generation module and is configured to detect the to-be-sampled signal at an edge of the target sampling signal to generate a detection result signal.

According to multiple embodiments, a second aspect of the present application provides a detection method configured to detect phase information between two clock signals of different frequencies. The two clock signals include a low frequency clock signal and a high frequency clock signal. The detection method includes the following operations.

The low frequency clock signal is detected at an edge of the high frequency clock signal to generate a to-be-sampled signal, and a target sampling signal is generated when the high frequency clock signal is kept at a preset level and the low frequency clock signal meets a preset condition.

The to-be-sampled signal is detected at an edge of the target sampling signal to generate a detection result signal.

The details of one or more embodiments of the present application are set forth in the accompanying drawings and description below. Other features and advantages of the present application will be apparent from the specification, drawings and claims.

BRIEF DESCRIPTION OF THE DRAWINGS

In order to make the description clearer, a simple introduction on the accompanying drawings which are needed in the description of the embodiments or conventional art is given below. Apparently, the accompanying drawings in the description below are merely some of the embodiments of the application. Other drawings may be obtained by those of ordinary skill in the art without any creative effort according to the drawings.

The description of reference numerals is as follows.

Signal generation module: 100; first generation module: 110; fifth flip-flop: 111; sixth flip-flop: 112; seventh flip-flop: 113; second generation module: 120; first sampling unit: 121; first flip-flop: 1211; second flip-flop: 1212; second sampling unit: 122; third flip-flop: 1221; fourth flip-flop: 1222; logic gate unit: 123; and sampling module: 200.

DETAILED DESCRIPTION

In an actual using process, a clock signal needs to pass through an input buffer first to improve the performance of the clock signal. However, delay may occur after the clock signal passes through the input buffer, and even a first pulse of a high frequency clock signal may be filtered out due to factors such as an unstable working state, thereby making a phase detection result incorrect. Therefore, the reliability of the existing phase detection circuit and detection method is insufficient.

To facilitate the understanding of the embodiments of the present application, the embodiments of the present application will be described below in detail with reference to the accompanying drawings. Some of the embodiments of the present application are illustrated in the accompanying drawings. However, the embodiments of the present application may be embodied in many different forms and should not be limited to the embodiments set forth herein. Rather, these embodiments are provided so that the disclosure of the embodiments of the present application will be thorough and complete.

Unless defined otherwise, all technical and scientific terms used herein have the same meaning as commonly understood by those of ordinary skill in the art to which the embodiments of the present application belong. The terms used herein in the specification of the embodiments of the present application are for the purpose of describing specific embodiments only and are not intended to limit the embodiments of the present application. As used herein, the term "and/or" includes any and all combinations of one or more of the associated listed items.

It will be appreciated that although the terms "first", "second", and the like used in the present application may be used herein to describe various elements, these elements may not be limited by these terms. These terms are only adopted to distinguish one element from another element. For example, without departing from the scope of the present application, a first flip-flop 1211 may be called a second flip-flop 1212, and similarly, the second flip-flop 1212 may be called the first flip-flop 1211. Both the first flip-flop 1211 and the second flip-flop 1212 are flip-flops, but they are not the same flip-flop.

It will be appreciated that "connection" in the following embodiments should be understood to mean "electrical connection", "communication connection", and the like, if connected circuits, modules, units, and the like transfer electrical signals or data between each other.

As used herein, the singular forms "a", "an", and "said/the" may include the plural forms as well, unless the context clearly indicates otherwise. It is also to be understood that the terms "comprise/include" or "have", or the like specify the presence of a stated feature, integer, step, operation, component, part, or a combination thereof, but do not preclude the presence or addition of one or more other features, integers, steps, operations, components, parts, or combinations thereof. Meanwhile, the term "and/or" used in the specification includes any and all combinations of the associated listed items.

Figure 1:
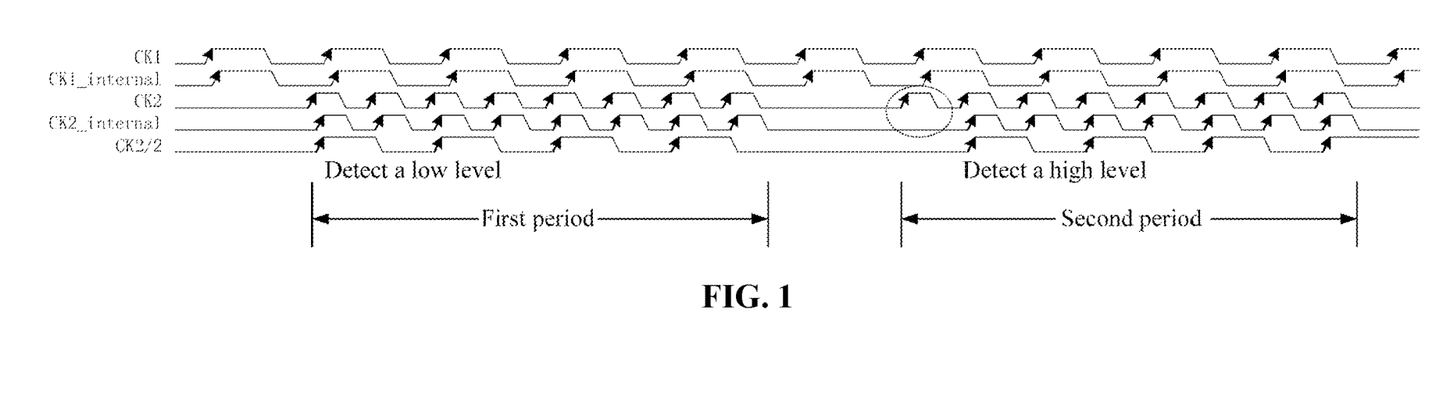
FIG. 1 is a timing sequence diagram of a phase detection result in some embodiments.

FIG. 1 is a timing sequence diagram of a phase detection result in some embodiments. Referring to FIG. 1, two to-be-detected clock signals are CK1 and CK2 respectively, and a low frequency clock signal and a high frequency clock signal after passing through an input buffer are CK1_internal and CK2_internal respectively. Typically, frequency division processing needs to be performed on the high frequency clock signal CK2_internal to obtain a signal CK2/2 with the same frequency as that of the low frequency clock signal CK1_internal, and then the signal CK2/2 and the low frequency clock signal CK1_internal are compared to obtain phase information between the two to-be-detected clock signals. It is to be noted that a high frequency and a low frequency in the low frequency clock signal CK1_internal and the high frequency clock signal CK2_internal refer to the relativity of the frequencies of the two clock signals (that is, one of the two clock signals with a lower frequency is taken as the low frequency clock signal CK1_internal, one with a higher frequency is taken as the high frequency clock signal CK2_internal) and do not refer in particular to that a signal in a certain determined frequency range is the low frequency clock signal or the high frequency clock signal.

As shown in FIG. 1, in a first period, a low level state of the low frequency clock signal CK1_internal is sampled at a rising edge of the signal CK2/2, that is, a low level is detected to generate a detection result. In a second period, a first pulse in the high frequency clock signal CK2_internal is filtered out, and a pulse in a circle of the signal CK2 is lost, so that a timing sequence of the frequency-divided signal CK2/2 is changed. A high level state of the low frequency clock signal CK1_internal will be sampled at the rising edge of the signal CK2/2, that is, a high level is detected to generate a detection result, and an error occurs in the detection result. The first period and the second period refer to the first period and the second period of the high frequency clock signal CK2_internal. Referring to FIG. 1, each period includes a plurality of rising edge signals set at equal time intervals t1. Each rising edge signal is configured such that the low frequency clock signal CK1_internal is sampled once. Further, a preset level is kept for a preset duration t2 between two adjacent periods of the high frequency clock signal CK2_internal, and the duration t2 is longer than the above time interval t1, for example, the duration t2 may be equal to the duration of two time intervals t1, thereby distinguishing different periods.

Figure 2:
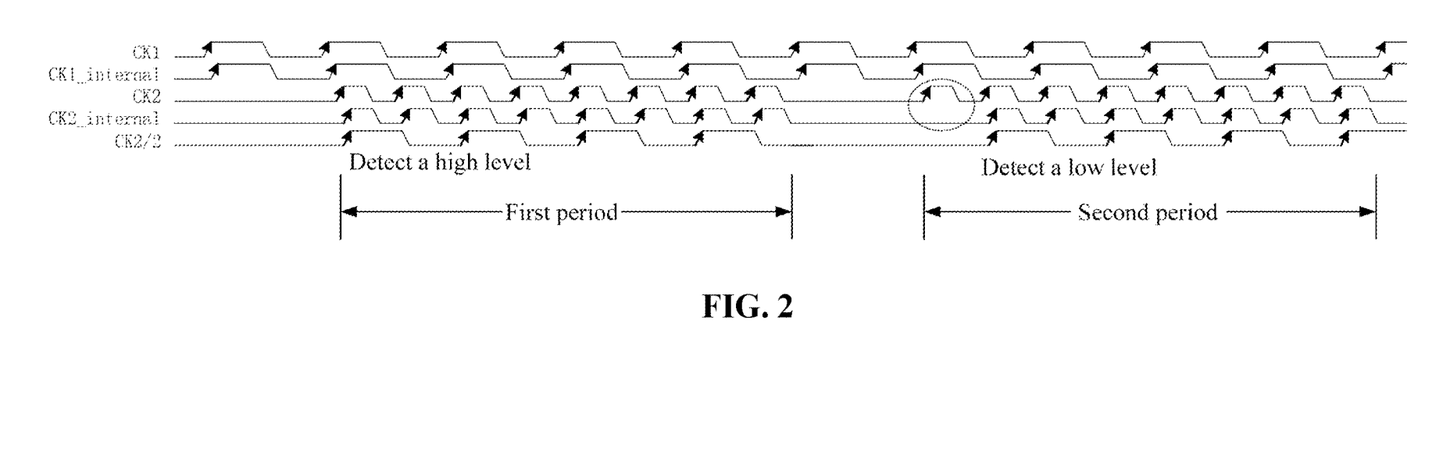
FIG. 2 is a timing sequence diagram of another phase detection result in some embodiments.

FIG. 2 is a timing sequence diagram of another phase detection result in some embodiments. Referring to FIG. 2, in the first period, the high level state of the low frequency clock signal CK1_internal is sampled at the rising edge of the signal CK2/2, that is, the high level is detected to generate the detection result. In the second period, the first pulse in the high frequency clock signal CK2_internal is filtered out, and the pulse in the circle of the signal CK2 is lost, resulting in that the timing sequence of the frequency-divided signal CK2/2 is changed. The low level state of the low frequency clock signal CK1_internal will be sampled at the rising edge of the signal CK2/2, that is, the low level is detected to generate the detection result, and an error occurs in the detection result.

Therefore, referring to FIG. 1 to FIG. 2, such a detection circuit may cause a problem of an incorrect detection result due to the fact that the first pulse in the high frequency clock signal CK2_internal is filtered out.

Figure 3:
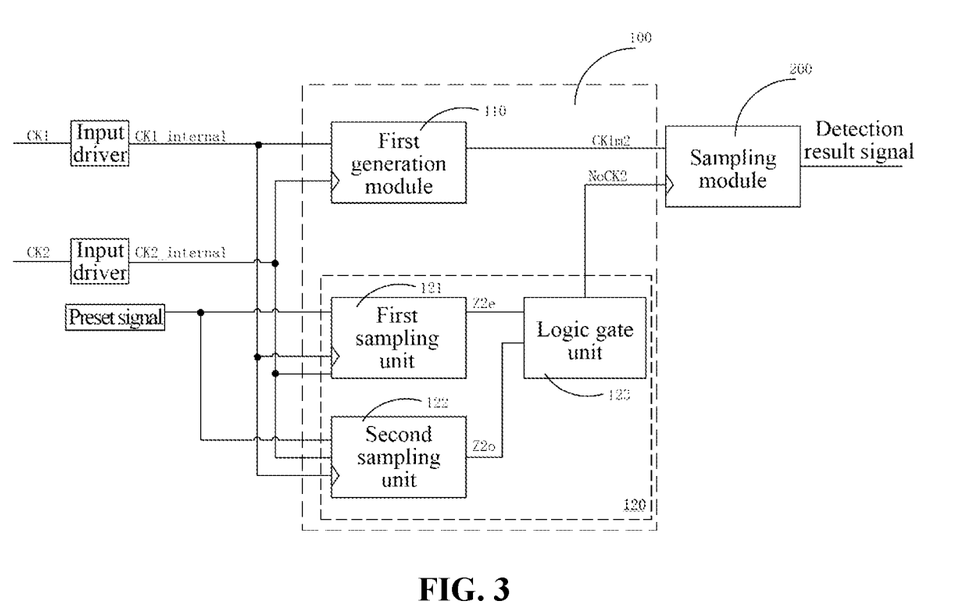
FIG. 3 is a schematic block diagram of a detection circuit of an embodiment.

FIG. 3 is a schematic block diagram of a detection circuit of an embodiment. In the embodiment, the detection circuit is configured to detect phase information between two clock signals of different frequencies. The two clock signals include a low frequency clock signal CK1_internal and a high frequency clock signal CK2_internal. The above two signals refer to signals output after the to-be-detected clock signals CK1 and CK2 pass through an input buffer respectively. It is to be noted that in other embodiments, definitions of the low frequency clock signal CK1_internal and the high frequency clock signal CK2_internal are the same as those in the embodiment and will not be described in detail.

Referring to FIG. 3, the detection circuit includes a signal generation module 100 and a sampling module 200.

The signal generation module 100 is configured to detect the low frequency clock signal CK1_internal at an edge of the high frequency clock signal CK2_internal to generate a to-be-sampled signal CK1$m$2, and generate a target sampling signal NoCK2 when the high frequency clock signal CK2_internal is kept at a preset level and the low frequency clock signal CK1_internal meets a preset condition.

Identical to the low frequency clock signal CK1_internal and the high frequency clock signal CK2_internal in FIGS. 1 and 2, in the embodiment, the low frequency clock signal CK1_internal is a continuous clock signal, and the high frequency clock signal CK2_internal is a discontinuous clock signal. In each period in which the high frequency clock signal occurs, a plurality of high frequency clock signal pulses are included. Interval time exists between two adjacent periods. In the interval time, the high frequency clock signal CK2_internal is kept at a preset level. Therefore, when the high frequency clock signal CK2_internal is kept at the preset level greater than or equal to preset duration, this indicates that it is currently in the interval time between two adjacent periods. It is to be noted that in other embodiments, the low frequency clock signal CK1_internal may also be the discontinuous clock signal, and the disclosure does not impose a limitation on this.

Figure 4:
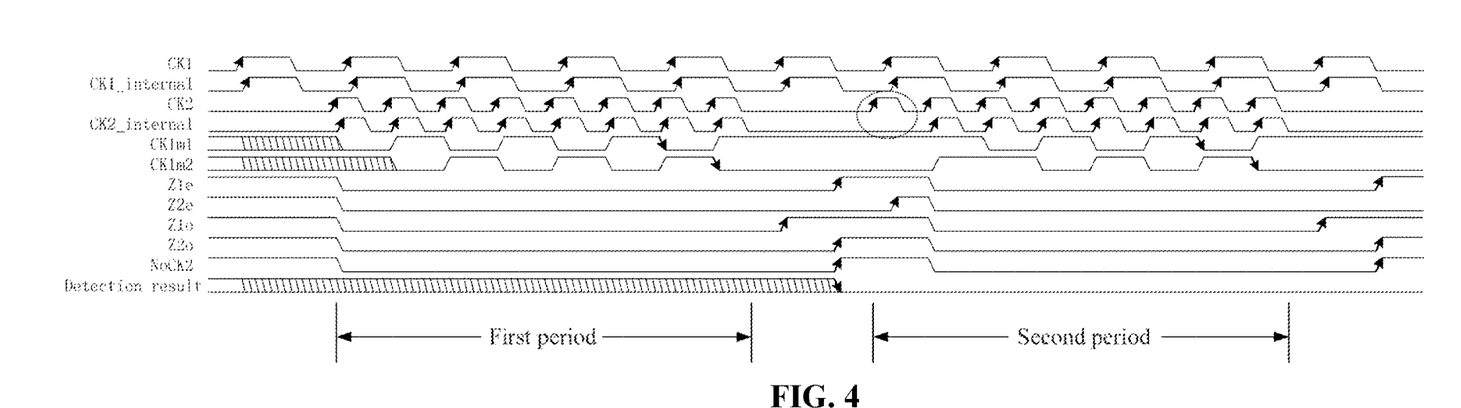
FIG. 4 is a timing sequence diagram generated through detection of a low level of a low frequency clock signal by a detection circuit of an embodiment.

FIG. 4 is a timing sequence diagram generated through detection of a low level of a low frequency clock signal by a detection circuit of an embodiment. Referring to FIG. 4, in the embodiment, a rising edge in the target sampling signal NoCK2 is not generated in response to a rising edge or a falling edge of the high frequency clock signal CK2_internal in the period, but is generated between two adjacent periods of the high frequency clock signal CK2_internal. Therefore, even if part of the pulses of the signal in the period are filtered out or other distortion phenomena occur, the target sampling signal NoCK2 will not be influenced. The to-be-sampled signal is generated in response to the edge of the high frequency clock signal CK2_internal, and the low frequency clock signal CK1_internal is preliminarily sampled to generate the to-be-sampled signal CK1$m$2 matched with the period of the high frequency clock signal CK2_internal.

With continued reference to FIG. 3, the sampling module 200 is connected with the signal generation module 100 and is configured to detect the to-be-sampled signal CK1$m$2 at the edge of the target sampling signal NoCK2 to generate a detection result signal. Based on the above circuit structure, one pulse signal in the target sampling signal NoCK2 is generated in correspondence with each period in the high frequency clock signal CK2_internal, and the pulse signal is generated between two adjacent periods of the high frequency clock signal CK2_internal. Therefore, identical to the target sampling signal NoCK2, the detection result signal is also not influenced by the pulse variation in the period of the high frequency clock signal CK2_internal.

The high frequency clock signal CK2_internal of the above detection circuit continuously outputs the preset level between two periods, that is, after each period of the high frequency clock signal CK2_internal, only when the low frequency clock signal meets the preset condition, the detection result is output. Therefore, even if the first pulse in a single period of the high frequency clock signal CK2_internal is filtered out, the detection result will not be influenced, thereby realizing the detection circuit with the high reliability.

In one embodiment, with continued reference to FIG. 3, the signal generation module 100 includes a first generation module 110 and a second generation module 120.

A data end of the first generation module 110 is connected with the low frequency clock signal CK1_internal, a clock end of the first generation module 110 is connected with the high frequency clock signal CK2_internal, and the first generation module 110 is configured to detect the low frequency clock signal CK1_internal at the edge of the high frequency clock signal CK2_internal to generate the to-be-sampled signal CK1$m$2.

A data end of the second generation module 120 is connected with a preset signal, a clock end of the second generation module 120 is connected with the low frequency clock signal CK1_internal, a control end of the second generation module 120 is connected with the high frequency clock signal CK2_internal, and the second generation module 120 is configured to, when the high frequency clock signal CK2_internal is kept at the preset level, detect the preset signal at an edge of the low frequency clock signal CK1_internal to generate the target sampling signal NoCK2. The preset signal may be a high level signal, or may be a low level signal. After the preset signal is detected at the edge of the low frequency clock signal CK1_internal, the target sampling signal NoCK2 is switched to a level state the same as that of the preset signal to generate the rising edge or the falling edge. For example, if the preset signal is the high level signal, in response to the edge of the low frequency clock signal CK1_internal, the target sampling signal NoCK2 is switched from the low level state to the high level state to generate one rising edge, thereby sampling the to-be-sampled signal CK1$m$2.

In one embodiment, with continued reference to FIG. 3, a data end of the sampling module 200 is connected with the first generation module 110, a clock end of the sampling module 200 is connected with the second generation module 120, and the sampling module 200 is configured to detect the to-be-sampled signal CK1$m$2 at the edge of the target sampling signal NoCK2 to generate the detection result signal.

In one embodiment, the second generation module 120 includes a first sampling unit 121, a second sampling unit 122, and a logic gate unit 123.

A data end of the first sampling unit 121 is connected with the preset signal, a clock end of the first sampling unit 121 is connected with the low frequency clock signal CK1_internal, a control end of the first sampling unit 121 is connected with the high frequency clock signal CK2_internal, and the first sampling unit 121 is configured to, when the low frequency clock signal CK1_internal outputs a level signal of a first preset condition, generate a first sampling signal Z2$e$ with the level state the same as that of the preset signal.

A data end of the second sampling unit 122 is connected with the preset signal, a clock end of the second sampling unit 122 is connected with the low frequency clock signal, a control end of the second sampling unit 122 is connected with the high frequency clock signal CK2_internal, and the second sampling unit 122 is configured to, when the low frequency clock signal CK1_internal outputs the level signal of a second preset condition, generate a second sampling signal Z2$o$ with the level state the same as that of the preset signal.

With continued reference to FIG. 4, in the first period, the first pulse of the high frequency clock signal CK2_internal is not filtered out, and when the high frequency clock signal CK2_internal is kept at the preset level (kept at the low level in the embodiment of FIG. 4), the low frequency clock signal CK1_internal successively outputs one rising edge and one falling edge first. In the second period, the first pulse of the high frequency clock signal CK2_internal is filtered out, and when the high frequency clock signal CK2_internal is kept at the preset level, the low frequency clock signal CK1_internal successively outputs one rising edge and one falling edge first. Therefore, through setting the first sampling unit 121 and the second sampling unit 122, as well as making the two sampling units performing sampling based on the low frequency clock signal CK1_internal outputting the level signals of different preset conditions respectively, it is ensured that a correct sampling signal can be generated regardless of whether the first pulse of the high frequency clock signal CK2_internal is filtered out.

With continued reference to FIG. 3, two input ends of the logic gate unit 123 are respectively connected with the first sampling unit 121 and the second sampling unit 122. The logic gate unit 123 is configured to generate the target sampling signal NoCK2 according to the first sampling signal Z2$e$ and the second sampling signal Z2$o$. The logic gate unit 123 logically processes the first sampling signal Z2$e$ and the second sampling signal Z2$o$ to select a desired sampling signal, i.e., the target sampling signal NoCK2, from the two sampling signals, thereby outputting a correct phase detection result. The logic gate unit 123 may be one of an AND gate, an OR gate, an AND-OR gate, a NAND gate and the like which can implement the above function.

Further, when the preset signal is the high level signal, in response to the low frequency clock signal CK1_internal meeting the preset condition, the first sampling signal Z2e and the second sampling signal Z2o are switched from the low level state to the high level state; when the preset signal is the low level signal, in response to the low frequency clock signal CK1_internal meeting the preset condition, the first sampling signal Z2e and the second sampling signal Z2o are switched from the high level state to the low level state. Different level states need to correspond to different logic gate units 123 so as to generate the target sampling signal NoCK2. Therefore, a corresponding relationship exists between the logic function of the logic gate unit 123 and the preset signal input by the second generation module 120.

In one embodiment, the first preset condition is that the low frequency clock signal CK1_internal successively outputs one falling edge signal and one rising edge signal in sequence. The second preset condition is that the low frequency clock signal CK1_internal successively outputs one rising edge signal and one falling edge signal in sequence. The first sampling unit 121 generates the first sampling signal Z2e in response to the first preset condition, and the second sampling unit 122 generates the second sampling signal Z2o in response to the second preset condition. In the embodiment, regardless of whether the first pulse of the high frequency clock signal CK2_internal is filtered out, the second sampling signal Z2o is always taken as the target sampling signal NoCK2 through the logic gate unit 123, thereby ensuring that one correct sampling signal can be generated regardless of whether the first pulse of the high frequency clock signal CK2_internal is filtered out.

In one embodiment, the preset signal is the high level signal, the logic gate unit 123 is an OR gate circuit, and the control end of the first sampling unit 121 and the control end of the second sampling unit 122 are reset ends. That is, when an enable signal is input to the control end of the first sampling unit 121 and the control end of the second sampling unit 122, that is, when a non-preset level signal is input to the control end (as in one embodiment, if the preset level is the low level, the high level signal is input to the control end), both the first sampling unit 121 and the second sampling unit 122 output 0 as an initial output state of the first sampling unit 121 and the second sampling unit 122. Therefore, when the low frequency clock signal CK1_internal outputs the level signal meeting the first preset condition or the second preset condition, correspondingly, the first sampling signal Z2e or the second sampling signal Z2o is switched to the high level state of the preset signal, that is, the "1" state.

In one embodiment, the preset signal is the low level signal, the logic gate unit 123 is a NAND gate circuit, and the control end of the first sampling unit 121 and the control end of the second sampling unit 122 are set ends. That is, when an enable signal is input to the control end of the first sampling unit 121 and the control end of the second sampling unit 122, that is, when a non-preset level signal is input to the control end (as in one embodiment, if the preset level is the low level, the high level signal is input to the control end), both the first sampling unit 121 and the second sampling unit 122 output 1 as an initial output state of the first sampling unit 121 and the second sampling unit 122. Therefore, when the low frequency clock signal CK1_internal outputs the level signal meeting the first preset condition or the second preset condition, correspondingly, the first sampling signal Z2e or the second sampling signal Z2o is switched to the low level state of the preset signal, that is, the "0" state.

Figure 6:
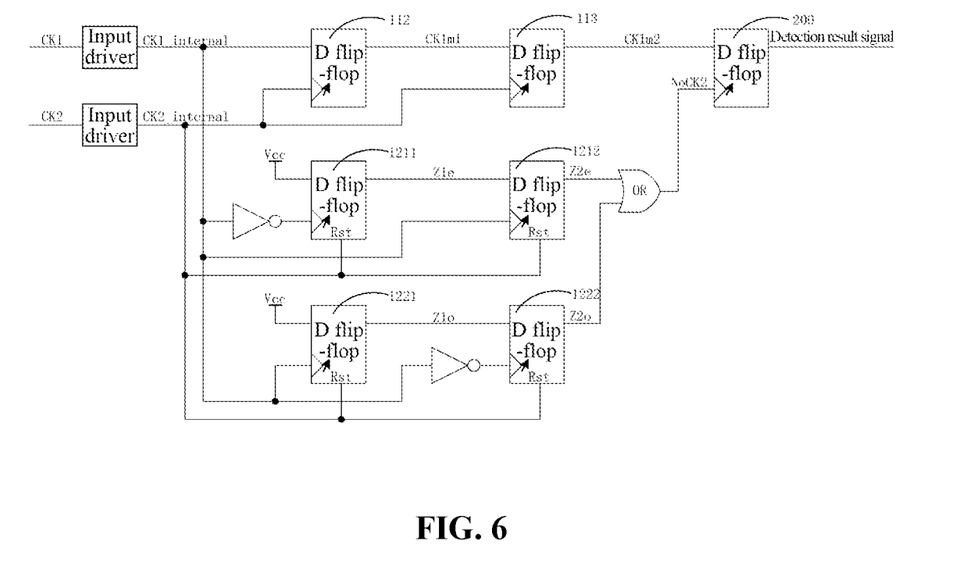
FIG. 6 is a structural diagram of a detection circuit of an embodiment.

FIG. 6 is a structural diagram of a detection circuit of an embodiment. Referring to FIG. 4 and FIG. 6, in the embodiment, the first sampling unit 121 includes a first flip-flop 1211 and a second flip-flop 1212.

A data end of the first flip-flop 1211 is connected with the preset signal, a clock end of the first flip-flop 1211 is connected with the low frequency clock signal CK1_internal through an inverter, a control end of the first flip-flop 1211 is connected with the high frequency clock signal CK2_internal, and the first flip-flop 1211 is configured to generate a first condition signal Z1e when the falling edge signal in the first preset condition is detected.

In the embodiment shown in FIG. 6, all flip-flops are D flip-flops, the control ends of all flip-flops are reset ends, the reset ends are enabled at the high level, and the preset signal is the high level signal. When the high frequency clock signal CK2_internal is at the high level, the first flip-flop 1211 outputs 0. When the high frequency clock signal CK2_internal is at the low level, in response to the signal input from the clock end of the first flip-flop 1211, that is, the rising edge of an inverted signal of the low frequency clock signal CK1_internal, the preset signal Vcc is sampled, or in response to the falling edge of the low frequency clock signal CK1_internal, the preset signal Vcc is sampled.

It will be appreciated that in the embodiment, in a pulse period of the high frequency clock signal CK2_internal, the falling edge of the low frequency clock signal CK1_internal is all in a high level period of the high frequency clock signal CK2_internal, that is, the first flip-flop 1211 will not sample the preset signal Vcc input from the input end. Therefore, in the pulse period of the high frequency clock signal CK2_internal, the output end of the first flip-flop 1211 always outputs the low level, and outside the pulse period of the high frequency clock signal CK2_internal, that is, between two adjacent periods, the first flip-flop 1211 samples the preset signal Vcc and generates the rising edge in the first condition signal Z1e. It is to be noted that the above description is only intended to exemplarily explain the timing sequence diagram shown in FIG. 4, and is not intended to specifically limit the protection scope of the present application, that is, the interval duration between the adjacent rising edges of the low frequency clock signal CK1_internal is not limited to be two times the interval duration between the adjacent rising edges of the high frequency clock signal CK2_internal in the embodiment of FIG. 4. In other embodiments, both the low frequency clock signal CK1_internal and the high frequency clock signal CK2_internal may be adjusted accordingly according to a test requirement, and are not limited to the above case that the falling edge of the low frequency clock signal CK1_internal is all in the high level period of the high frequency clock signal CK2_internal. For other low frequency clock signals CK1_internal and high frequency clock signals CK2_internal after adjustment, the detection circuit based on the embodiment of the present application can also output the correct detection signal.

The second flip-flop 1212 is connected with the first flip-flop 1211, a clock end of the second flip-flop 1212 is connected with the low frequency clock signal CK1_internal, a control end of the second flip-flop 1212 is connected with the high frequency clock signal CK2_internal, an input end of the second flip-flop 1212 is connected with the output end of the first flip-flop 1211, and the second flip-flop 1212 is configured to delay the first condition signal Z1e to generate the first sampling signal Z2e. Similar to the first flip-flop 1211, outside the pulse period of the high frequency clock signal CK2_internal, that is, between the two adjacent periods, in response to the rising edge of the low frequency clock signal CK1_internal, the second flip-flop 1212 samples the first condition signal Z1e to generate the first sampling signal Z2e. That is, the first flip-flop 1211 implements the recognition of the falling edge in the first preset condition, and the second flip-flop 1212 implements the recognition of the rising edge in the first preset condition, thereby together generating the first sampling signal Z2e.

With continued reference to FIG. 6, in one embodiment, the second sampling unit 122 includes a third flip-flop 1221 and a fourth flip-flop 1222.

A data end of the third flip-flop 1221 is connected with the preset signal Vcc, a clock end of the third flip-flop 1221 is connected with the low frequency clock signal CK1_internal, a control end of the third flip-flop 1221 is connected with the high frequency clock signal CK2_internal, and the third flip-flop 1221 is configured to generate a second condition signal Z1o when the rising edge signal in the second preset condition is detected.

When the high frequency clock signal CK2_internal is at the high level, the third flip-flop 1221 outputs 0. When the high frequency clock signal CK2_internal is at the low level, in response to the signal input from the clock end of the third flip-flop 1221, that is, the rising edge of the low frequency clock signal CK1_internal, the preset signal Vcc is sampled. It will be appreciated that in the pulse period of the high frequency clock signal CK2_internal, the moments of the rising edges of the low frequency clock signal CK1_internal are all within the high level period of the high frequency clock signal CK2_internal, that is, the preset signal Vcc input from the input end will not be sampled. Therefore, in the pulse period of the high frequency clock signal CK2_internal, the output end of the third flip-flop 1221 always outputs the low level, and outside the pulse period of the high frequency clock signal CK2_internal, that is, between two adjacent periods, the third flip-flop 1221 samples the preset signal Vcc and generates the rising edge in the second condition signal Z1o.

A data end of the fourth flip-flop 1222 is connected with the third flip-flop 1221, a clock end of the fourth flip-flop 1222 is connected with the low frequency clock signal CK1_internal, a control end of the fourth flip-flop 1222 is connected with the high frequency clock signal CK2_internal, and an input end of the fourth flip-flop 1222 is connected with the output end of the third flip-flop 1221. The fourth flip-flop 1222 is configured to delay the second condition signal Z1zZ2e to generate the second sampling signal Z2o. Similar to the third flip-flop 1221, outside the pulse period of the high frequency clock signal CK2_internal, that is, between the two adjacent periods, in response to the falling edge of the low frequency clock signal CK1_internal, the fourth flip-flop 1222 samples the first condition signal Z1e to generate the second sampling signal Z2oZ2e. That is, the third flip-flop 1221 implements the recognition of the falling edge in the second preset condition, and the fourth flip-flop 1222 implements the recognition of the rising edge in the second preset condition, thereby together generating the second sampling signal Z2o.

Figure 5:
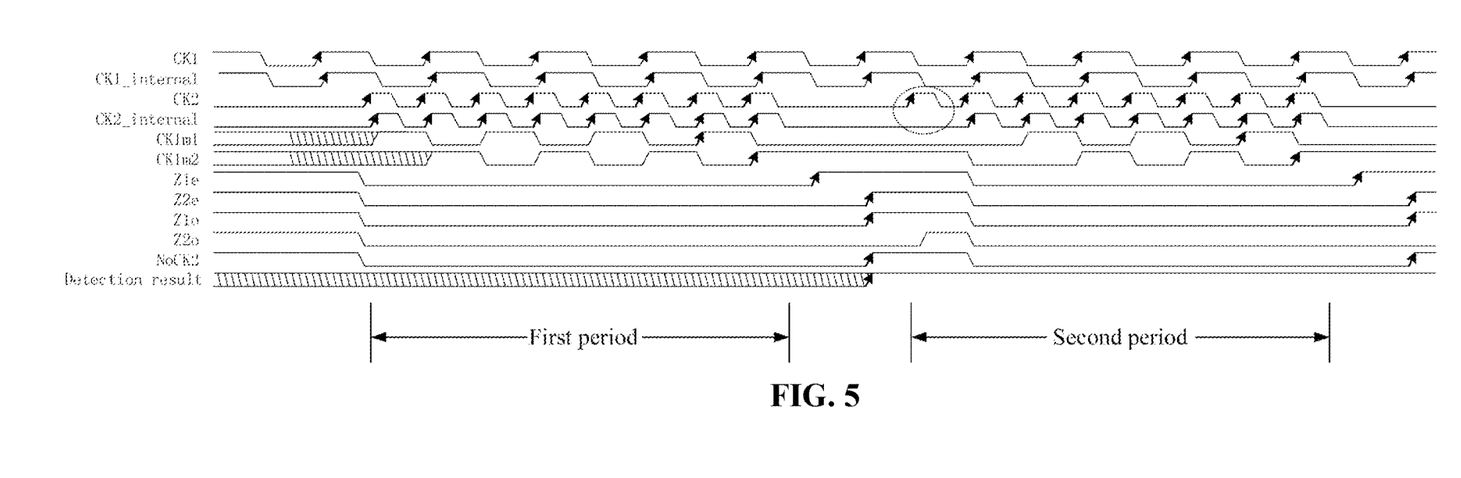
FIG. 5 is a timing sequence diagram generated through detection of a high level of a low frequency clock signal by a detection circuit of an embodiment.

FIG. 5 is a timing sequence diagram generated through detection of a low level of a high frequency clock signal by a detection circuit of an embodiment. The sampling logic when the high level is detected referring to is similar to that of FIG. 4 when the low level is detected. That is, when the high frequency clock signal CK2_internal is kept at the low level, in response to the falling edge and the rising edge successively generated in sequence in the low frequency clock signal CK1_internal, the detection circuit generates the rising edge in the first sampling signal Z2e, and in response to the rising edge and the falling edge successively generated in sequence in the low frequency clock signal CK1_internal, the detection circuit generates the rising edge in the second sampling signal Z2o. As can be seen from FIG. 4 and FIG. 5, the detection circuit of the embodiment is applicable to two different sampling modes of high level sampling and low level sampling, and has higher flexibility and compatibility.

Further, when the logic gate circuit of the embodiment is the OR gate, that is, at least one of the first sampling signal Z2e or the second sampling signal Z2o is at the high level, the target sampling signal NoCK2 is at the high level, thereby obtaining the accurate target sampling signal NoCK2.

Figure 7:
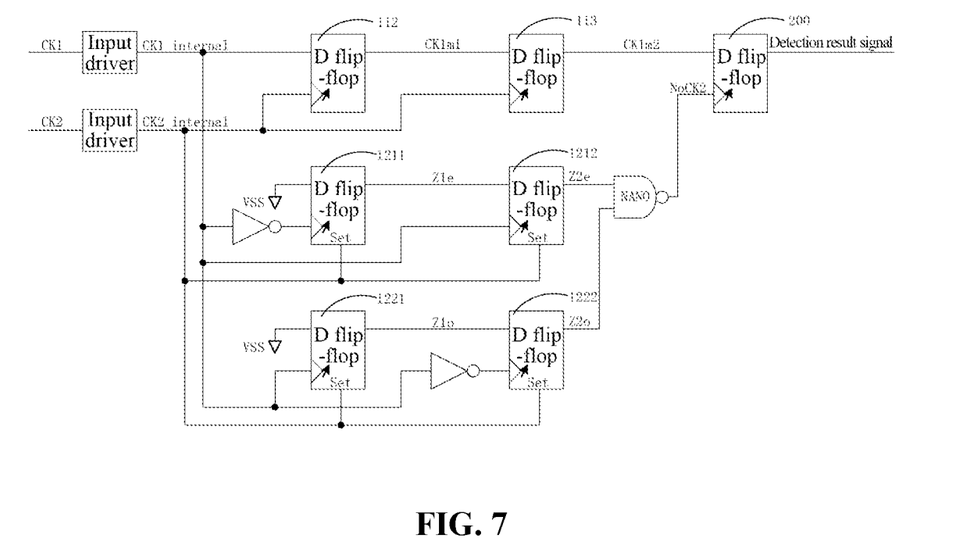
FIG. 7 is a structural diagram of a detection circuit of another embodiment.

FIG. 7 is a structural diagram of a detection circuit of another embodiment. Referring to FIG. 7, in the embodiment, the control ends of all flip-flops are set ends, and the set ends are enabled at the high level, and the preset signal is the low level signal. When the high frequency clock signal CK2_internal is at the high level, each flip-flop outputs 1. When the high frequency clock signal CK2_internal is at the low level, each flip-flop responds to the signal input from the clock end to sample the preset signal Vss input from the input end. Therefore, when the high frequency clock signal CK2_internal is at the low level, the first flip-flop 1211 samples the preset signal Vss in response to the falling edge of the low frequency clock signal CK1_internal to generate the falling edge in the first condition signal Z1e, and the first condition signal Z1e is delayed through the second flip-flop 1212 to generate the first sampling signal Z2e. Accordingly, the third flip-flop 1221 samples the preset signal Vss in response to the rising edge of the low frequency clock signal CK1_internal to generate the falling edge in the second condition signal Z1o, and the second condition signal Z10 is delayed through the second flip-flop 1212 to generate the second sample signal Z2o.

Further, when the logic gate circuit 123 of the embodiment is the NAND gate, that is, at least one of the first sampling signal Z2e or the second sampling signal Z2o is at the low level, the target sampling signal NoCK2 is at the high level, thereby obtaining the accurate target sampling signal NoCK2.

Figure 8:
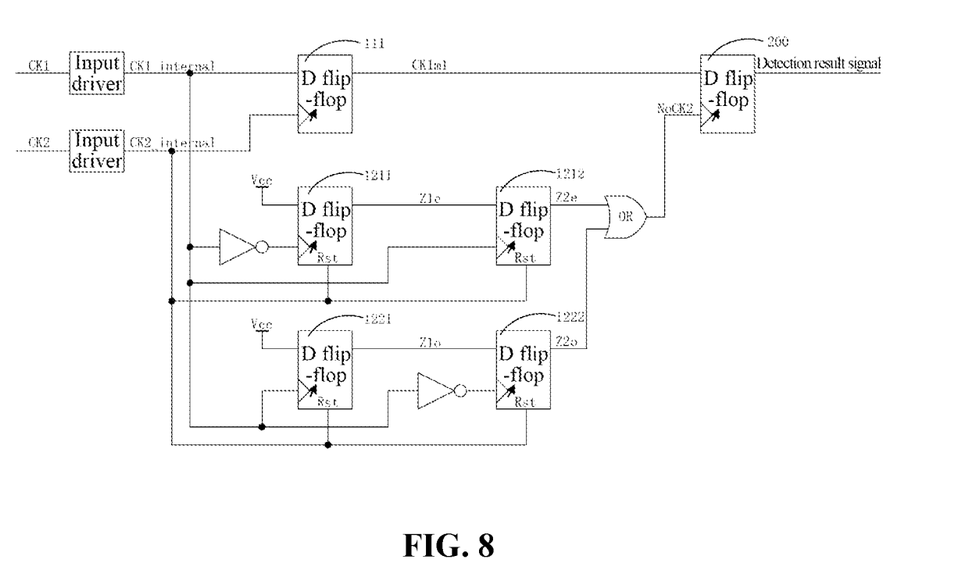
FIG. 8 is a structural diagram of a detection circuit of yet another embodiment.

FIG. 8 is a structural diagram of a detection circuit of yet another embodiment. The detection circuit of the embodiment is applicable to the high frequency clock signal CK2_internal including an odd number of pulse signals in each period. Referring to FIG. 8, the first generation module 110 includes a fifth flip-flop 111. A data end of the fifth flip-flop 111 is connected with the low frequency clock signal CK1_internal, a clock end of the fifth flip-flop 111 is connected with the high frequency clock signal CK2_internal, an output end of the fifth flip-flop 111 is connected with the data end of the sampling module 200, and the fifth flip-flop 111 is configured to detect the low frequency clock signal CK1_internal at the edge of the high frequency clock signal CK2_internal to generate an initial to-be-sampled signal CK1m1. The initial to-be-sampled signal CK1m1 is taken as a to-be-sampled signal CK1m2.

With continued reference to FIG. 6 and FIG. 7, when each period of the high frequency clock signal CK2_internal includes an even number of pulse signals, the first generation module 110 includes a sixth flip-flop 112 and a seventh flip-flop 113.

As for the sixth flip-flop 112, a data end of the sixth flip-flop 112 is connected with the low frequency clock signal CK1_internal, a clock end of the sixth flip-flop 112 is connected with the high frequency clock signal CK2_internal, and the sixth flip-flop 112 is configured to detect the low frequency clock signal CK1_internal at the edge of the high frequency clock signal CK2_internal to generate the initial to-be-sampled signal CK1$m$1.

As for the seventh flip-flop 113, a data end of the seventh flip-flop 113 is connected with the sixth flip-flop 112, a clock end of the seventh flip-flop 113 is connected with the high frequency clock signal CK2_internal, an output end of the seventh flip-flop 113 is connected with the data end of the sampling module 200, and the seventh flip-flop 113 is configured to delay the initial to-be-sampled signal CK1$m$1 to generate the to-be-sampled signal CK1$m$2.

In the embodiment, the seventh flip-flop 113 is set to delay the initial to-be-sampled signal CK1$m$1 to flip the level state of the initial to-be-sampled signal CK1$m$1 and generate the to-be-sampled signal CK1$m$2, so as to sample a target level state of the low frequency clock signal CK1_internal.

A detection method is configured to detect phase information between two clock signals of different frequencies. The two clock signals include a low frequency clock signal CK1_internal and a high frequency clock signal CK2_internal. The detection method includes the following operations.

The low frequency clock signal CK1_internal is detected at an edge of the high frequency clock signal CK2_internal to generate a to-be-sampled signal CK1$m$2, and a target sampling signal NoCK2 is generated when the high frequency clock signal CK2_internal is kept at a preset level and the low frequency clock signal CK1_internal meets a preset condition.

The to-be-sampled signal CK1$m$2 is detected at an edge of the target sampling signal NoCK2 to generate a detection result signal.

In one embodiment, the operation that a target sampling signal NoCK2 is generated when the high frequency clock signal CK2_internal is kept at a preset level and the low frequency clock signal CK1_internal meets a preset condition includes the following operation.

When the high frequency clock signal CK2_internal is kept at the preset level, the preset signal is detected at the edge of the low frequency clock signal CK1_internal meeting the preset condition to generate the target sampling signal NoCK2.

In the embodiment, after each period of the high frequency clock signal CK2_internal, only when the low frequency clock signal meets the preset condition, the detection result is output. Therefore, even if the first pulse of the high frequency clock signal CK2_internal in a single period is filtered out, the detection result will not be influenced, thereby realizing the detection circuit with the high reliability.

The detection method in the above embodiment corresponds to the detection circuit in the above embodiment, and the detailed description may refer to the corresponding embodiment of the detection circuit and will not be described in detail herein.

The technical features of the above embodiments may be combined freely. In order to describe briefly, the description is not made on all possible combinations of the technical features of the embodiments. However, the combinations of these technical features should be considered as a scope of the specification as long as there is no contradiction.

The above embodiments only describe several implementation modes of the embodiments of the present application. The description is specific and detailed, but cannot be understood as a limitation to the scope of the patent of the disclosure accordingly. It is to be noted that several variations and modifications may also be made by those skilled in the art without departing from the spirit of the embodiments of the present application, which all fall within the protection scope of the embodiments of the present application. Therefore, the protection scope of the patent of the embodiment of present application shall be subjected to the appended claims.

What is claimed is:

1. A detection circuit, configured to detect phase information between two clock signals of different frequencies, the two clock signals comprising a low frequency clock signal and a high frequency clock signal, the detection circuit comprising:
a signal generation module, configured to detect the low frequency clock signal at an edge of the high frequency clock signal to generate a to-be-sampled signal, and generate a target sampling signal in a case where the high frequency clock signal is kept at a preset level and the low frequency clock signal meets a preset condition; and
a sampling module, connected with the signal generation module and configured to detect the to-be-sampled signal at an edge of the target sampling signal to generate a detection result signal.

2. The detection circuit of claim 1, wherein the signal generation module comprises:
a first generation module, a data end of the first generation module being connected with the low frequency clock signal, a clock end of the first generation module being connected with the high frequency clock signal, and the first generation module being configured to detect the low frequency clock signal at the edge of the high frequency clock signal to generate the to-be-sampled signal; and
a second generation module, a data end of the second generation module being connected with a preset signal, a clock end of the second generation module being connected with the low frequency clock signal, a control end of the second generation module being connected with the high frequency clock signal, and the second generation module being configured to, in a case where the high frequency clock signal is kept at the preset level, detect the preset signal at an edge of the low frequency clock signal to generate the target sampling signal.

3. The detection circuit of claim 2, wherein a data end of the sampling module is connected with the first generation module, a clock end of the sampling module is connected with the second generation module, and the sampling module is configured to detect the to-be-sampled signal at the edge of the target sampling signal to generate the detection result signal.

4. The detection circuit of claim 3, wherein the second generation module comprises:
a first sampling unit, a data end of the first sampling unit being connected with the preset signal, a clock end of the first sampling unit being connected with the low frequency clock signal, a control end of the first sampling unit being connected with the high frequency clock signal, and the first sampling unit being configured to, in a case where the low frequency clock signal outputs a level signal of a first preset condition, generate a first sampling signal with a level state identical with a level state of the preset signal;

a second sampling unit, a data end of the second sampling unit being connected with the preset signal, a clock end of the second sampling unit being connected with the low frequency clock signal, a control end of the second sampling unit being connected with the high frequency clock signal, and the second sampling unit being configured to, in a case where the low frequency clock signal outputs the level signal of a second preset condition, generate a second sampling signal with a level state identical with the level state of the preset signal; and a logic gate unit, two input ends of the logic gate unit being respectively connected with the first sampling unit and the second sampling unit, and the logic gate unit being configured to generate the target sampling signal according to the first sampling signal and the second sampling signal.

5. The detection circuit of claim 4, wherein the preset signal is a high level signal, the logic gate unit is an OR gate circuit, the control end of the first sampling unit and the control end of the second sampling unit are reset ends.

6. The detection circuit of claim 4, wherein the preset signal is a low level signal, the logic gate unit is a NAND gate circuit, the control end of the first sampling unit and the control end of the second sampling unit are set ends.

7. The detection circuit of claim 4, wherein the first preset condition is that the low frequency clock signal successively outputs one falling edge signal and one rising edge signal in sequence, and the second preset condition is that the low frequency clock signal successively outputs one rising edge signal and one falling edge signal in sequence.

8. The detection circuit of claim 7, wherein the first sampling unit comprises:

a first flip-flop, a data end of the first flip-flop being connected with the preset signal, a clock end of the first flip-flop being connected with the low frequency clock signal through an inverter, a control end of the first flip-flop being connected with the high frequency clock signal, and the first flip-flop being configured to generate a first condition signal in a case where the falling edge signal in the first preset condition is detected; and a second flip-flop, connected with the first flip-flop, a clock end of the second flip-flop being connected with the low frequency clock signal, a control end of the second flip-flop being connected with the high frequency clock signal, and the second flip-flop being configured to delay the first condition signal to generate the first sampling signal.

9. The detection circuit of claim 7, wherein the second sampling unit comprises:

a third flip-flop, a data end of the third flip-flop being connected with the preset signal, a clock end of the third flip-flop being connected with the low frequency clock signal, a control end of the third flip-flop being connected with the high frequency clock signal, and the third flip-flop being configured to generate a second condition signal in a case where the rising edge signal in the second preset condition is detected; and a fourth third flip-flop, a data end of the fourth flip-flop being connected with the third flip-flop, a clock end of the fourth flip-flop being connected with the low frequency clock signal, a control end of the fourth flip-flop being connected with the high frequency clock signal, and the fourth flip-flop being configured to delay the second condition signal to generate the second sampling signal.

10. The detection circuit of claim 2, wherein each period of the high frequency clock signal comprises an odd number of pulse signals, the first generation module comprises:

a fifth flip-flop, a data end of the fifth flip-flop being connected with the low frequency clock signal, a clock end of the fifth flip-flop being connected with the high frequency clock signal, an output end of the fifth flip-flop being connected with the data end of the sampling module, and the fifth flip-flop being configured to detect the low frequency clock signal at the edge of the high frequency clock signal to generate the to-be-sampled signal.

11. The detection circuit of claim 2, wherein each period of the high frequency clock signal comprises an even number of pulse signals, the first generation module comprises:

a sixth flip-flop, a data end of the sixth flip-flop being connected with the low frequency clock signal, a clock end of the sixth flip-flop being connected with the high frequency clock signal, and the sixth flip-flop being configured to detect the low frequency clock signal at the edge of the high frequency clock signal to generate an initial to-be-sampled signal; and a seventh flip-flop, a data end of the seventh flip-flop being connected with the sixth flip-flop, a clock end of the seventh flip-flop being connected with the high frequency clock signal, an output end of the seventh flip-flop being connected with the data end of the sampling module, and the seventh flip-flop being configured to delay the initial to-be-sampled signal to generate the to-be-sampled signal.

12. A detection method, configured to detect phase information between two clock signals of different frequencies, the two clock signals comprising a low frequency clock signal and a high frequency clock signal, the detection method comprising:

detecting the low frequency clock signal at an edge of the high frequency clock signal to generate a to-be-sampled signal, and generating a target sampling signal in a case where the high frequency clock signal is kept at a preset level and the low frequency clock signal meets a preset condition; and detecting the to-be-sampled signal at an edge of the target sampling signal to generate a detection result signal.

13. The detection method of claim 12, wherein generating the target sampling signal in the case where the high frequency clock signal is kept at the preset level and the low frequency clock signal meets the preset condition comprises:

in a case where the high frequency clock signal is kept at the preset level, detecting the preset signal at an edge of the low frequency clock signal meeting the preset condition to generate the target sampling signal.

* * * * *